(12) United States Patent
Bleeker et al.

(10) Patent No.: US 10,222,702 B2
(45) Date of Patent: Mar. 5, 2019

(54) RADIATION SOURCE

(71) Applicant: ASML Netherlands B.V., Veldhoven (NL)

(72) Inventors: Arno Jan Bleeker, Westerhoven (NL); Ramon Mark Hofstra, Beekbergen (NL); Erik Petrus Buurman, Veldhoven (NL); Johannes Hubertus Josephina Moors, Helmond (NL); Alexander Matthijs Struycken, Eindhoven (NL); Harm-Jan Voorma, Kerkdriel (NL); Sumant Sukdew Ramanujan Oemrawsingh, Hazerswoude Dorp (NL); Markus Franciscus Antonius Eurlings, Tilburg (NL); Peter Frans Maria Muys, Ghent (BE)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/550,855

(22) PCT Filed: Jan. 21, 2016

(86) PCT No.: PCT/EP2016/051242
§ 371 (c)(1),
(2) Date: Aug. 14, 2017

(87) PCT Pub. No.: WO2016/131601
PCT Pub. Date: Aug. 25, 2016

(65) Prior Publication Data
US 2018/0031979 A1 Feb. 1, 2018

(30) Foreign Application Priority Data
Feb. 19, 2015 (EP) .................................. 15155790

(51) Int. Cl.
*G03F 7/00* (2006.01)
*G03F 7/20* (2006.01)
(Continued)

(52) U.S. Cl.
CPC ....... *G03F 7/70033* (2013.01); *G02B 27/141* (2013.01); *G03F 7/70025* (2013.01);
(Continued)

(58) Field of Classification Search
CPC ............. G03F 7/70033; G03F 7/70025; G03F 7/70566; H01S 3/2308; H01S 3/0064;
(Continued)

(56) References Cited

U.S. PATENT DOCUMENTS 6,222,861 B1   4/2001 Kuo et al.
2003/0076607 A1   4/2003 Antoni et al.
(Continued)

FOREIGN PATENT DOCUMENTS

DE   102011006003   5/2012
WO   WO 2011/116898 A1   9/2011

OTHER PUBLICATIONS

International Search Report directed to related International Patent Application No. PCT/EP2016/051242, dated May 2, 2016; 4 pages.
(Continued)

*Primary Examiner* — Michael Maskell
(74) *Attorney, Agent, or Firm* — Sterne, Kessler, Goldstein & fox P.L.L.C.

(57) ABSTRACT

A laser radiation source for a lithographic tool comprising a laser module to emit a first laser beam having a first wavelength and a second laser beam having a second wavelength, a beam separation device to separate the optical paths of the first and second laser beams and substantially recombine the optical paths, a beam delivery system to direct the first and second laser beams to a fuel target and an (Continued)

optical isolation apparatus to: adjust the polarization state of the first laser beam, adjust the polarization state of the second laser beam and to block radiation having the adjusted polarization states such that the reflection of the first laser beam and the reflection of the second laser beam are substantially blocked from propagating towards the laser module.

15 Claims, 4 Drawing Sheets

(51) Int. Cl.
  *H01S 3/00* (2006.01)
  *G02B 27/14* (2006.01)
  *H05G 2/00* (2006.01)
  *H01S 3/23* (2006.01)

(52) U.S. Cl.
  CPC ........ *G03F 7/70566* (2013.01); *H01S 3/0064* (2013.01); *H01S 3/2308* (2013.01); *H05G 2/005* (2013.01); *H01S 3/2316* (2013.01); *H05G 2/008* (2013.01)

(58) Field of Classification Search
  CPC .... H01S 3/2316; G02B 27/141; H05G 2/005; H05G 2/008
  USPC ............................... 250/504 R, 492.1–492.3
  See application file for complete search history.

(56) References Cited

U.S. PATENT DOCUMENTS

| | | |
|---|---|---|
| 2003/0223546 A1 | 12/2003 | McGregor et al. |
| 2004/0264512 A1 | 12/2004 | Hartlove et al. |
| 2006/0215712 A1 | 9/2006 | Ziener et al. |
| 2008/0087847 A1 | 4/2008 | Bykanov et al. |
| 2008/0149862 A1 | 6/2008 | Hansson et al. |
| 2008/0179548 A1 | 7/2008 | Bykanov et al. |
| 2009/0073401 A1 | 3/2009 | Buis et al. |
| 2010/0108913 A1 | 5/2010 | Ershov et al. |
| 2012/0092746 A1 | 4/2012 | Hou et al. |
| 2012/0206704 A1 | 8/2012 | Wangler et al. |
| 2012/0235066 A1* | 9/2012 | Ershov ................ G03F 7/70033 250/504 R |
| 2012/0280149 A1 | 11/2012 | Mestrom et al. |
| 2014/0072006 A1* | 3/2014 | Sandstrom ............ H01S 3/1305 372/38.01 |

OTHER PUBLICATIONS

International Preliminary Report on Patentability directed to related International Patent Application No. PCT/EP2016/051242, dated Aug. 22, 2017; 7 pages.
"Alternative Seed Layer Design," Research Disclosure Statement, No. 592081, ISSN 0374-4353; 2013, 10 pages.
Research Disclosure Statement, No. 592081, ISSN 0374-4353; 2013; 8 pages.
"Obtaining optical contrast in grazing-incidence EUV mirrors by local heating," Research Disclosure Statement, No. 519021, ISSN 0374-4353; 2007; 6 pages.

* cited by examiner

RADIATION SOURCE

CROSS-REFERENCE TO RELATED APPLICATIONS

This application claims priority of EP application 15155790.7 which was filed on 19 Feb. 2015 and which is incorporated herein in its entirety by reference.

FIELD

The present invention relates to a laser system. The present invention has particular, but not exclusive, use within radiation sources for producing an EUV radiation generating plasma.

BACKGROUND

A lithographic apparatus is a machine constructed to apply a desired pattern onto a substrate. A lithographic apparatus can be used, for example, in the manufacture of integrated circuits (ICs). A lithographic apparatus may for example project a pattern from a patterning device (e.g. a mask) onto a layer of radiation-sensitive material (resist) provided on a substrate.

The wavelength of radiation used by a lithographic apparatus to project a pattern onto a substrate determines the minimum size of features which can be formed on that substrate. A lithographic apparatus which uses EUV radiation, being electromagnetic radiation having a wavelength within the range 4-20 nm, may be used to form smaller features on a substrate than a conventional lithographic apparatus (which may for example use electromagnetic radiation with a wavelength of 193 nm).

EUV radiation may be produced using a radiation source arranged to generate an EUV producing plasma. An EUV producing plasma may be generated, for example, by exciting a fuel, for example liquid tin, within the radiation source. The fuel may be excited by directing a beam of initiating radiation, such as a laser beam, at a target comprising the fuel, the initiating radiation beam causing the fuel target to become an EUV generating plasma.

It is desirable to provide an EUV radiation source which obviates or mitigates one or more of the problems of the prior art, whether identified herein or elsewhere.

SUMMARY

According to a first aspect of the invention there is provided a laser radiation source for a lithographic tool, the laser radiation source comprising a laser module configured to emit a first laser beam having a first wavelength and a second laser beam having a second wavelength, a beam separation device configured to separate the optical paths of the first and second laser beams and substantially recombine the optical paths of the first and second laser beams, a beam delivery system configured to direct the first and second laser beams to be incident on a fuel target and an optical isolation apparatus configured to adjust the polarization state of the first laser beam such that a reflection of the first laser beam from the fuel target has a first polarization state, adjust the polarization state of the second laser beam such that a reflection of the second laser beam from the fuel target has a second polarization state; and block radiation having the first and second polarization states such that the reflection of the first laser beam and the reflection of the second laser beam are substantially blocked from propagating towards the laser module.

The beam separation device advantageously provides separated optical paths of the first and second laser beams which allows the first and second laser beams to be treated separately. For example, the polarization state of the first and/or the second laser beam may be adjusted independently of the other of the first and/or the second laser beam. Additionally or alternatively the reflection of the first and/or the second laser beam may be blocked independently of the other of the first and/or the second laser beam. Allowing for independent treatment of the first and second laser beams advantageously allows both the reflection of the first and the second laser beam to be substantially blocked so as to substantially prevent the reflections from reaching the laser module. Substantially preventing the reflections of the first and the second laser beams from reaching the laser module advantageously reduces any damage which is caused to the laser module by reflected laser beams. Preventing the reflections of the first and the second laser beams from reaching the laser module additionally advantageously reduces the chance of the laser radiation source from an entering an unstable mode of operation.

The optical isolation apparatus may comprise a first polarization adjuster arranged in the separated optical path of the first laser beam, wherein the first polarization adjuster is configured to adjust the polarisation state of the first laser beam independently of the second laser beam.

Independent adjustment of the polarization state of the first laser beam may advantageously allow the polarization state of the first laser beam to be adjusted such that the polarization state is substantially the same as the polarization state of the second laser beam for at least a portion of the optical paths of the first and second laser beams. This may allow a single polarizer to be placed in the common optical path of the first and second laser beams and which substantially blocks the reflections of the first and the second laser beams.

The optical isolation apparatus may further comprise a second polarization adjuster arranged in the optical path of the second laser beam wherein the second polarization adjuster is configured to adjust the polarisation state of the second laser beam.

The second polarization adjuster may be arranged in the separated optical path of the second laser beam and may be configured to adjust the polarisation state of the second laser beam independently of the first laser beam.

The first polarization state may be the same as the second polarization state and the optical isolation apparatus may comprise a polarizer positioned in the optical path of both the first laser beam and the second laser beam, wherein the polarizer is configured to block radiation having the first and second polarization states.

The optical isolation apparatus may comprise a first polarizer positioned in the optical path of the first laser beam wherein the first polarizer is configured to block radiation having the first polarization state and a second polarizer positioned in the optical path of the second laser beam wherein the second polarizer is configured to block radiation having the second polarization state.

The first and second polarization states may be different from each other.

The first polarizer may be positioned in the separated optical path of the first laser beam and may not be positioned in the optical path of the second laser beam.

The optical isolation apparatus may comprise at least one phase retarder configured to cause a phase retardance in the first and/or second laser beams.

The at least one phase retarder may be configured to convert a substantially linear polarization state to a substantially circular polarization state and to convert a substantially circular polarization state to a substantially linear polarization state.

The phase retarder may comprise a reflective phase retarder.

The phase retardance which is caused by the reflective phase retarder may be a function of the angle of incidence of the first and/or second laser beams on the reflective phase retarder and the phase retarder may further comprise an actuator configured to alter the orientation of the reflective phase retarder so as to alter the angle of incidence of the first and/or second laser beams on the reflective phase retarder.

According to a second aspect of the invention there is provided a laser radiation source for a lithographic tool, the laser radiation source comprising a first seed laser configured to emit a first laser beam having a first wavelength, a first amplifier configured to amplify the first laser beam, a second seed laser configured to emit a second laser beam having a second wavelength which is different to the first wavelength, a second amplifier configured to amplify the second laser beam, a beam combination apparatus configured to substantially combine the optical paths of the first amplified laser beam and the second amplified laser beam and a beam delivery system configured to direct the first and second amplified laser beams to be incident on a fuel target.

The laser radiation source may further comprise a first optical isolator arranged in the optical path of the first laser beam between the first amplifier and the beam combination apparatus, wherein the first optical isolator is configured to substantially block a reflection of the first laser beam from the fuel target from propagating towards the first amplifier.

The laser radiation source may further comprise a second optical isolator arranged in the optical path of the second laser beam between the second amplifier and the beam combination apparatus, wherein the second optical isolator is configured to substantially block a reflection of the second laser beam from the fuel target from propagating towards the second amplifier.

According to a third aspect of the invention there is provided a radiation source comprising a fuel emitter configured to emit a fuel and direct the fuel so as to provide a fuel target and a laser radiation source according to the first or the second aspect and configured to illuminate the fuel target with first and second laser beams.

The fuel may comprise tin.

The first laser beam may be configured to alter the shape of the fuel target.

The second laser beam may be configured to excite the fuel target to form a plasma which emits EUV radiation.

According to a fourth aspect of the invention there is provided a lithographic system comprising a radiation source according to the third aspect and a lithographic apparatus arranged to receive a radiation beam from the radiation source, the lithographic apparatus comprising: an illumination system configured to condition the radiation beam received from the radiation source, a support structure constructed to support a patterning device, the patterning device being capable of imparting the radiation beam with a pattern in its cross-section to form a patterned radiation beam; a substrate table constructed to hold a substrate and a projection system configured to project the patterned radiation beam onto the substrate.

According to a fifth aspect of the invention there is provided a method of providing first and second laser beams, the method comprising emitting a first laser beam having a first wavelength and a second laser beam having a second wavelength from a laser module, separating the optical paths of the first and second laser beams and substantially recombining the optical paths of the first and second laser beams, directing the first and second laser beams to be incident on a fuel target, adjusting the polarization state of the first laser beam such that a reflection of the first laser beam from the fuel target has a first polarization state, adjusting the polarization state of the second laser beam such that a reflection of the second laser beam from the fuel target has a second polarization state and blocking radiation having the first and second polarization states such that the reflection of the first laser beam and the reflection of the second laser beam are substantially blocked from propagating towards the laser module.

Adjusting the polarization state of the first laser beam may comprise adjusting the polarisation state of the first laser beam independently of the second laser beam.

Adjusting the polarization state of the second laser beam may comprise adjusting the polarisation state of the second laser beam independently of the first laser beam.

The first polarization state may be the same as the second polarization state.

Adjusting the polarization state of the first laser beam and/or adjusting the polarization state of the second laser beam may comprise causing a phase retardance in the first and/or second laser beams.

Adjusting the polarization state of the first laser beam and/or adjusting the polarization state of the second laser beam may comprise converting a substantially linear polarization state to a substantially circular polarization state and/or converting a substantially circular polarization state to a substantially linear polarization state.

It will be appreciated that one or more aspects or features described in the preceding or following descriptions may be combined with one or more other aspects or features.

According to another aspect a laser radiation source for a lithographic tool is provided, the laser radiation source comprising a laser apparatus configured to emit a laser beam and a beam delivery system configured to direct the laser beam to be incident upon a fuel target, wherein the laser radiation source further comprises an optical isolation apparatus configured to modify a transverse phase of the laser beam as it propagates towards the fuel target and to further modify the transverse phase of a portion of the laser beam which is reflected back from the fuel target; the modification and the further modification of the transverse phase adding together to provide a cumulative transverse phase modification of the reflected laser beam portion which diverts the reflected laser beam portion such that it does not re-enter the laser apparatus.

The reflected laser beam portion caused by the cumulative transverse phase modification may be diverted to be incident upon an aperture body. The reflected laser beam portion caused by the cumulative transverse phase modification may be diverted outside of a numerical aperture of the laser apparatus. The optical isolation apparatus may include a spiral phase plate which may be configured to apply a transverse phase which may be configured to apply a transverse phase modification of $2\pi$ radians multiplied by a non-zero integer.

BRIEF DESCRIPTION OF THE DRAWINGS

Embodiments of the invention will now be described, by way of example only, with reference to the accompanying schematic drawings, in which.

DETAILED DESCRIPTION

Figure 1:
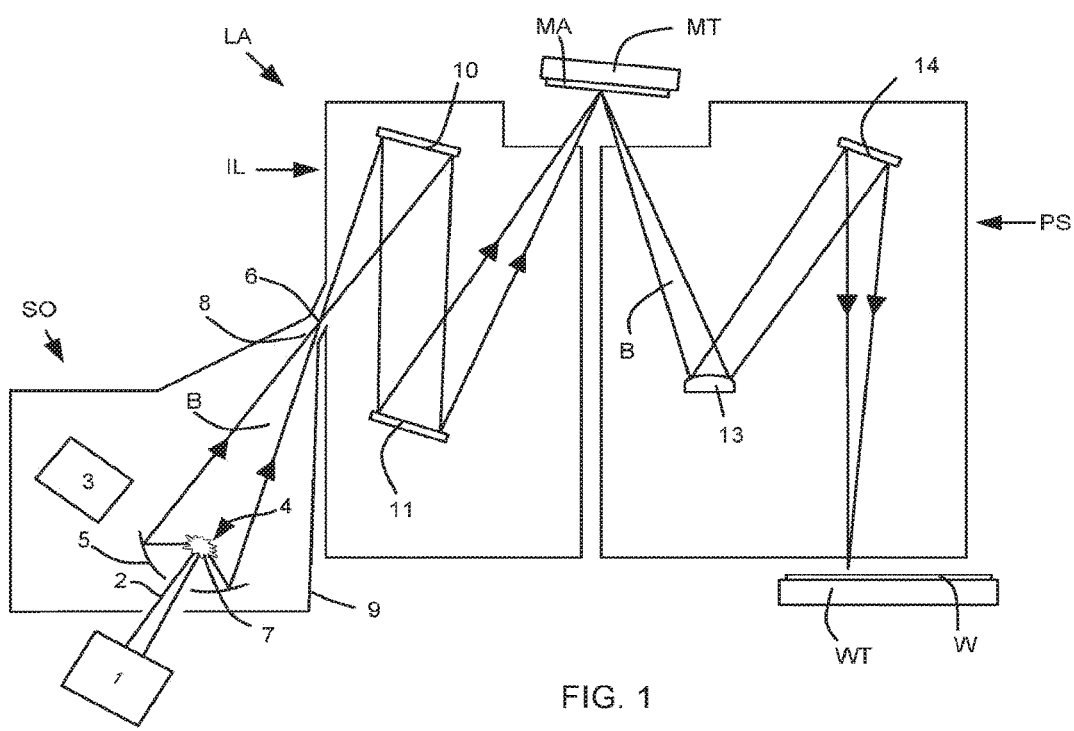
FIG. 1 is a schematic illustration of a lithographic system comprising a lithographic apparatus and a laser radiation source according to an embodiment of the invention.

FIG. 1 shows a lithographic system including a radiation source SO according to one embodiment of the invention. The lithographic system further comprises a lithographic apparatus LA. The radiation source SO is configured to generate an extreme ultraviolet (EUV) radiation beam B and may therefore be referred to as an EUV radiation source. The lithographic apparatus LA comprises an illumination system IL, a support structure MT configured to support a patterning device MA (e.g. a mask), a projection system PS and a substrate table WT configured to support a substrate W. The illumination system IL is configured to condition the radiation beam B before it is incident upon the patterning device MA. The projection system is configured to project the radiation beam B (now patterned by the mask MA) onto the substrate W. The substrate W may include previously formed patterns. Where this is the case, the lithographic apparatus aligns the patterned radiation beam B with a pattern previously formed on the substrate W.

The EUV radiation source SO, illumination system IL, and projection system PS may all be constructed and arranged such that they can be isolated from the external environment. A gas at a pressure below atmospheric pressure (e.g. hydrogen) may be provided in the EUV radiation source SO. A vacuum may be provided in the illumination system IL and/or the projection system PS. A small amount of gas (e.g. hydrogen) at a pressure well below atmospheric pressure may be provided in the illumination system IL and/or the projection system PS.

The EUV radiation source SO shown in FIG. 1 is of a type which may be referred to as a laser produced plasma (LPP) source. A laser radiation source 1 is arranged to deposit energy via a laser beam 2 into a fuel, which is provided from a fuel emitter 3. The laser beam 2 may be referred to as an initiating radiation beam. The fuel may for example be in liquid form, and may for example be a metal or alloy, such as tin (Sn). Although tin is referred to in the following description, any suitable fuel may be used. The fuel emitter 3 is configured to emit a fuel and direct the fuel to a plasma formation region 4 so as to provide a fuel target at the plasma formation region 4. The fuel emitter 3 may comprise a nozzle configured to direct tin, e.g. in the form of droplets, along a trajectory towards the plasma formation region 4. The laser beam 2 is incident upon the tin at the plasma formation region 4. The deposition of laser energy into the tin excites the tin to form a plasma 7 at the plasma formation region 4. Radiation, including EUV radiation, is emitted from the plasma 7 during de-excitation and recombination of ions of the plasma. The laser radiation source 1 may be used in a pulsed configuration, such that the laser beam 2 is a laser pulse. Where the fuel is provided as a droplet, a respective laser pulse may be directed at each fuel droplet.

The EUV radiation is collected and focused by a near normal incidence radiation collector 5 (sometimes referred to more generally as a normal incidence radiation collector). The collector 5 may have a multilayer structure which is arranged to reflect EUV radiation (e.g. EUV radiation having a desired wavelength such as 13.5 nm). The collector 5 may have an elliptical configuration, having two ellipse focal points. A first focal point may be at the plasma formation region 4, and a second focal point may be at an intermediate focus 6, as discussed below.

The laser radiation source 1 may be separated from the radiation source SO. Where this is the case, the laser beam 2 may be passed from the laser radiation source 1 to the radiation source SO with the aid of the beam delivery system. The laser radiation source 1 and the EUV radiation source SO may together be considered to be a radiation system.

Radiation that is reflected by the collector 5 forms a radiation beam B. The radiation beam B is focused at point 6 to form an image of the plasma formation region 4, which acts as a virtual radiation source for the illumination system IL. The point 6 at which the radiation beam B is focused may be referred to as the intermediate focus. The EUV radiation source SO is arranged such that the intermediate focus 6 is located at or near to an opening 8 in an enclosing structure 9 of the EUV radiation source SO.

The radiation beam B passes from the EUV radiation source SO into the illumination system IL, which is configured to condition the radiation beam B. The illumination system IL may include a facetted field mirror device 10 and a facetted pupil mirror device 11. The faceted field mirror device 10 and faceted pupil mirror device 11 together provide the radiation beam B with a desired cross-sectional shape and a desired angular distribution. The radiation beam B passes from the illumination system IL and is incident upon the patterning device MA held by the support structure MT. The patterning device MA reflects and patterns the radiation beam B. The illumination system IL may include other mirrors or devices in addition to or instead of the faceted field mirror device 10 and faceted pupil mirror device 11.

Following reflection from the patterning device MA the patterned radiation beam B enters the projection system PS. The projection system comprises a plurality of mirrors 13, 14 which are configured to project the radiation beam B onto a substrate W held by the substrate table WT. The projection system PS may apply a reduction factor to the radiation beam, forming an image with features that are smaller than corresponding features on the patterning device MA. A reduction factor of 4 may, for example, be applied. Although the projection system PS has two mirrors 13, 14 in FIG. 1, the projection system may include any number of mirrors.

Figure 2:
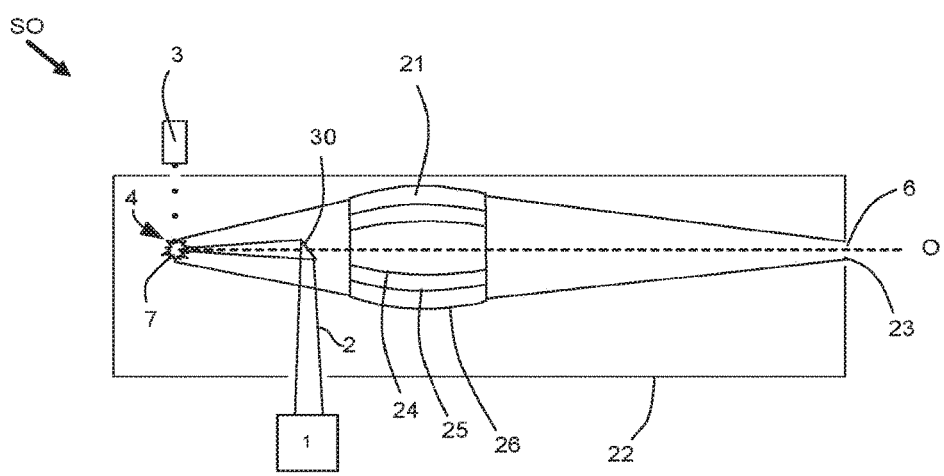
FIG. 2 is a schematic illustration of an alternative EUV radiation source comprising a laser radiation source according to an embodiment of the invention.

FIG. 2 shows a laser produced plasma (LPP) EUV radiation source SO which has an alternative configuration to the radiation source shown in FIG. 1. The EUV radiation source SO includes a fuel emitter 3 which is configured to deliver fuel to a plasma formation region 4. The fuel may, for example be tin, although any suitable fuel may be used. A laser source 1 emits a laser beam 2. The laser beam 2 is directed to be incident on the fuel at a plasma formation region 4. A mirror 30 is used to direct the laser beam 2 to the plasma formation region 4. The laser beam 2 delivers energy to the fuel and thereby converts the fuel into an EUV radiation emitting plasma 7.

A radiation collector 21, which may be a so-called grazing incidence collector, is configured to collect the EUV radiation and focus the EUV radiation at a point 6 which may be referred to as the intermediate focus. Thus, an image of the radiation emitting plasma 7 is formed at the intermediate focus 6. An enclosure structure 22 of the radiation source SO includes an opening 23 which is at or near to the intermediate focus 6. The EUV radiation passes through the opening 23 to an illumination system of a lithographic apparatus (e.g. of the form shown schematically in FIG. 1).

The radiation collector 21 may be a nested collector, with a plurality of grazing incidence reflectors 24, 25 and 26 (e.g. as schematically depicted). The grazing incidence reflectors 24, 25 and 26 may be disposed axially symmetrically around an optical axis O. The illustrated radiation collector 21 is shown merely as an example, and other radiation collectors may be used.

The EUV radiation sources SO shown in FIGS. 1 and 2 may include components which are not illustrated. For example, one or more contaminant traps may be included in the EUV radiation sources SO shown in FIGS. 1 and 2. A contaminant trap may be configured to prevent debris which may be emitted from a plasma formation region 4 from contaminating a radiation collector 5, 21. Additionally or alternatively a spectral filter may be provided in a radiation source. The spectral filter may be substantially transmissive for EUV radiation but substantially blocking for other wavelengths of radiation such as infrared radiation.

In order to improve a conversion efficiency (CE) with which energy from a laser beam 2 is converted to EUV radiation, a fuel may initially be illuminated with a pre-pulse laser beam before being illuminated by a main-pulse laser beam. For example, a pre-pulse laser beam may be generated and directed at the fuel in order to change a property of the fuel such as its size and/or shape, before a main-pulse, plasma generating, laser beam is directed at the fuel. A main-pulse may be incident on the fuel, for example, approximately 2 µs after a pre-pulse is incident on the fuel. The pre-pulse laser beam and the main-pulse laser beam may, for example, have repetition rates of approximately 50 kHz. A pre-pulse laser beam and a main-pulse laser beam may both be emitted from the same laser radiation source 1.

Figure 3:
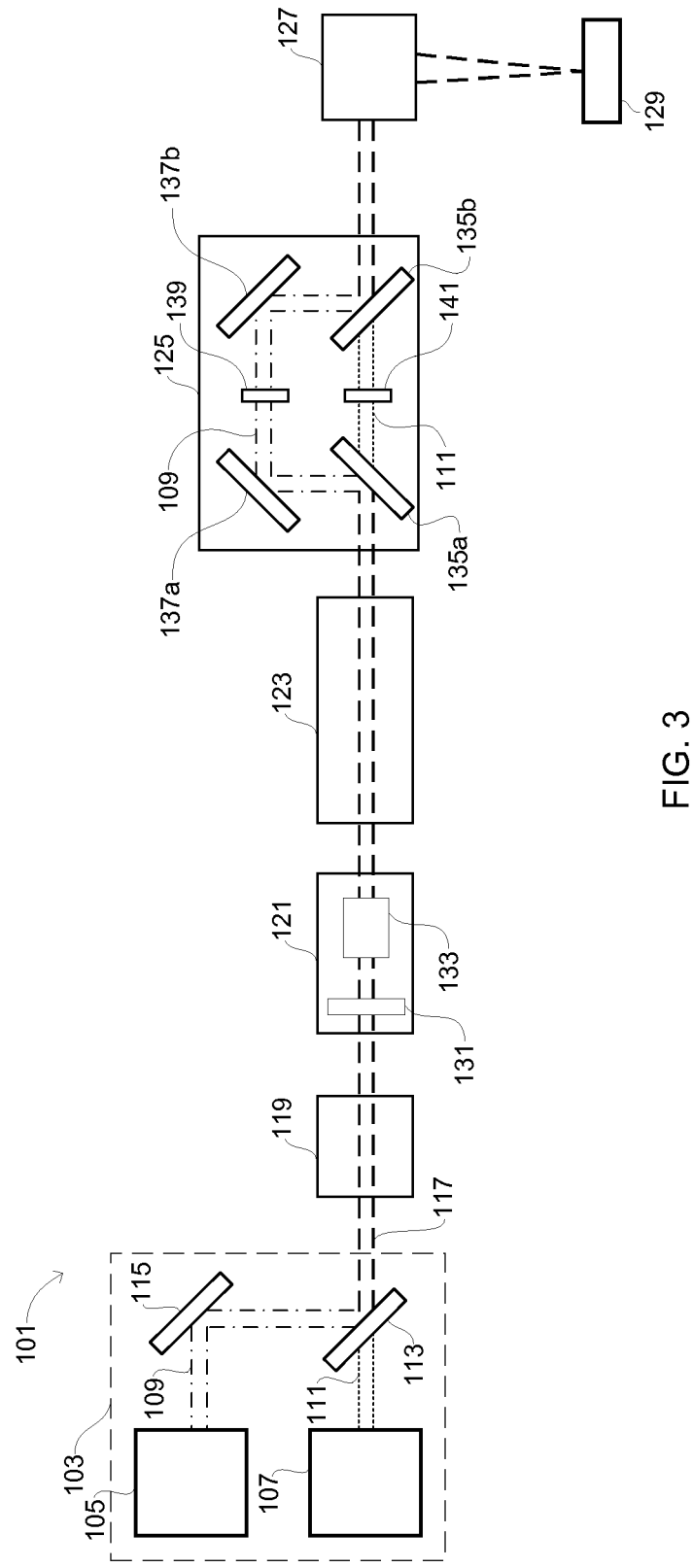
FIG. 3 is a schematic illustration of a laser radiation source according to an embodiment of the invention.

FIG. 3 schematically illustrates a laser radiation source 101 according to an embodiment of the invention. The laser radiation source 101 comprises a laser module 103. The laser module 103 comprises a pre-pulse seed laser 105 configured to emit a pre-pulse laser beam 109 and a main-pulse seed laser 107 configured to emit a main-pulse laser beam 111. The pre-pulse laser beam 109 and the main-pulse laser beam 111 have different wavelengths.

As will be described further below, the pre-pulse laser beam 109 and the main-pulse laser beam 111 may propagate through one or more gain media which cause amplification of the pre-pulse and main-pulse laser beams. The wavelengths of the pre-pulse and main-pulse laser beams may, for example, correspond to different rotational and/or vibrational energy transitions in a gain medium which may be used to amplify the pre-pulse and main-pulse laser beams. For example, in an embodiment the pre-pulse and main-pulse laser beams may be amplified in a gain medium comprising $CO_2$. In such an embodiment the pre-pulse laser beam may have a wavelength of approximately 10.26 µm and the main-pulse laser beam may have a wavelength of approximately 10.59 µm.

In order to amplify the pre-pulse and main-pulse laser beams in a common gain medium and to direct the pre-pulse and main-pulse laser beams to be incident on the same fuel target, the optical paths of the pre-pulse and main-pulse laser beams are combined using a beam combiner 113. In the embodiment which is shown in FIG. 3, a mirror 115 is arranged to direct the pre-pulse laser beam 109 to be incident on the beam combiner 113. The beam combiner 113 comprises a dichroic mirror which is configured to substantially transmit radiation having the wavelength of the main-pulse laser beam 111 and to substantially reflect radiation having the wavelength of the pre-pulse laser beam 109. The relative orientations of the pre-pulse seed laser 105, the main-pulse seed laser 107, the mirror 115 and the beam combiner 113 are such that the pre-pulse and main-pulse laser beams propagate out of the laser module 103 along a common optical path 117.

In other embodiments arrangements of optical components other than those shown in FIG. 3 may be used to combine the optical paths of the pre-pulse and main-pulse laser beams. For example, in some embodiments the beam combiner 113 may comprise a dichroic mirror which is configured to substantially reflect radiation having the wavelength of the main-pulse laser beam 111 and to substantially transmit radiation having the wavelength of the pre-pulse laser beam 109.

The common optical path 117 of the pre-pulse and main-pulse laser beams passes through a pre-amplifier 119, an optical isolator 121, an amplification stage 123, a beam-separation apparatus 125 and a beam delivery system 127. The beam delivery system 127 is configured to direct the pre-pulse and main-pulse laser beams to be incident on a fuel target 129. The beam delivery system 127 may, for example, comprise one or more optical components (e.g. mirrors and/or lenses) which are configured to direct and focus the pre-pulse and main-pulse laser beams onto the fuel target 129. The fuel target 129 may, for example, comprise a droplet of fuel (e.g. tin) at a plasma formation region 7 (e.g. the plasma formation regions 4 shown in FIGS. 1 and 2).

The pre-amplifier 119 and the amplification stage 123 each comprise at least one gain medium. The gain media of the pre-amplifier 119 and the amplification stage 123 are each pumped in order to bring about a state of population inversion within the gain media such that the pre-pulse and main-pulse laser beams experience a gain. A gain medium which forms the pre-amplifier 119 and/or the amplification stage 123 may, for example, comprise a gas. In an embodiment the gas may include $CO_2$. In some embodiments a gas which forms a gain medium may, for example, comprise helium and/or nitrogen. A gain medium may be pumped by electrical discharge. For example, a gain medium comprising a gas may be pumped with a radio frequency (RF) power source.

In some embodiments the amplification stage comprises a plurality of amplification chambers each comprising a pumped gain medium. The available gain in the amplification chambers may be different in different amplification chambers. For example, the gain which is experienced in each amplification chamber by a laser beam propagating through the amplification chambers may increase as the laser beam propagates from the laser module 103 and towards the fuel target 129.

As was described above the laser module 103 is configured to emit pulses of a pre-pulse laser beam 109 and a main-pulse laser beam 111 which are amplified and directed to be incident on a fuel target 129. Typically a pulse of the pre-pulse laser beam 109 is emitted prior to the emission of a corresponding pulse of the main-pulse laser beam 111. For example, a pulse of the pre-pulse laser beam 109 may be emitted approximately 2 µs prior to the emission of a pulse of the main-pulse laser beam 111. Pulses of the pre-pulse and main-pulse laser beams may be emitted with a frequency and phase such that their arrival at, for example, a plasma formation location 4 coincides with the arrival of a droplet of fuel at the plasma formation location 7 so as to provide a fuel target 129 on which the laser beams are incident.

A pulse of the pre-pulse laser beam 109 may change a property of the fuel target 129 such as its size and/or shape in order to prepare the fuel target 129 for illumination by a pulse of the main-pulse laser beam 111. The main-pulse laser beam 111 which is incident on the fuel target 129 may have a higher power than the pre-pulse laser beam 109 which is incident on the fuel target 129. For example, the pre-pulse laser beam 109 may be incident on the fuel target 129 with a power of approximately 3-5 kW whereas the main-pulse laser beam 111 may be incident on the fuel target 129 with a power of approximately 25 kW. The difference in power between the pre-pulse and main-pulse laser beams may result from the pre-pulse seed laser 105 and the main-pulse seed laser 107 emitting beams having different powers. Additionally the different wavelengths of the pre-pulse and main-pulse laser beams may result in the beams experiencing different gains in the pre-amplifier 119 and/or the amplification stage 123 thereby resulting in a different amplification of the pre-pulse and main-pulse laser beams. The power of the main-pulse laser beam 111 which is incident on the fuel target 129 is sufficient to excite the fuel target 129 to form an EUV radiation emitting plasma.

The fuel target 129 may reflect a portion of the pre-pulse laser beam 109 and a portion of the main-pulse laser beam 111. For example, the fuel target 129 may have a reflectivity of approximately 0.1%-1%. A reflection of the pre-pulse and main-pulse laser beams from the fuel target 129 will propagate back through the laser radiation source 101 along the same optical path along which the pre-pulse and main-pulse laser beams propagate from the pre-pulse seed laser 105 and the main-pulse seed laser 107 to the fuel target 129. A reflection from the fuel target 129 may therefore be amplified in the amplification stage and/or the pre-amplifier 119 before re-entering the pre-pulse seed laser 105 or the main-pulse seed laser 107. A reflection form the fuel target 129 which propagates back towards the laser module 103 may lead to one or more undesirable effects occurring in the laser radiation source 103.

For example, a reflected pulse which is allowed to re-enter the pre-pulse seed laser 105 or the main-pulse seed laser 107 may cause damage to the pre-pulse seed laser 105 or the main-pulse seed laser 107 and/or may lead to unstable operation of the pre-pulse seed laser 105 or the main-pulse seed laser 107.

Additionally or alternatively the propagation of a reflection of the pre-pulse laser beam 109 or the main-pulse laser beam 111 through the pre-amplifier 119, may temporarily reduce the available gain in the pre-amplifier 119 due to an effect which may be referred to as gain stripping. When a pulse of laser radiation propagates through a gain medium, energy from the gain medium is used to amplify the pulse of laser radiation. The energy which is stored by the gain medium is therefore reduced by a laser pulse propagating through the gain medium. The available gain of a gain medium is related to the energy which is stored by the gain medium and thus a pulse of laser radiation which propagates through a gain medium serves to temporarily reduce the available gain of the gain medium. After the pulse of laser radiation has passed through the gain medium the available gain increases again due to pumping of the gain medium (e.g. by electrical discharge). However the increase in the gain is not instantaneous and thus there is a period of time after propagation of a pulse of laser radiation through a gain medium during which the available gain is reduced.

Gain stripping in the pre-amplifier 119 may, for example, reduce the gain which is available to subsequent pulses of the main-pulse laser beam 111 and/or the pre-pulse laser beam 109. For example, a reflection of a pulse of the pre-pulse laser beam 109 may pass back through the pre-amplifier 119 prior to the emission of a corresponding pulse of the main-pulse laser beam 111 and may cause gain stripping in the pre-amplifier 119 which reduces the gain which is available to the corresponding pulse of the main-pulse laser beam 111. Amplification of the main-pulse laser beam 111 in the pre-amplifier 119 may therefore be reduced such that the power of the main-pulse laser beam 111 which is incident on the fuel target 129 is reduced. A reduction of the power of the main-pulse laser beam 111 which is incident on the fuel target will disadvantageously reduce the amount of energy which is deposited into the fuel target thereby reducing the amount of EUV radiation which is emitted from the fuel. It is therefore desirable to substantially prevent a reflection of the pre-pulse laser beam 109 from propagating through the pre-amplifier 119 so as to increase the power of the main-pulse laser beam 111 which is incident on the fuel target 129.

A reduction of the amount of energy which is deposited into the fuel target 129 may also lead to unstable operation of a radiation source SO. For example, a reduction in the amount of energy which is deposited into the fuel target 129 may increase an amount of debris which is produced by the fuel (because less of the fuel is converted into radiation emitting plasma). An increase in the amount of debris which is produced by the fuel may affect the trajectory of a subsequent droplet of fuel which is directed to the plasma formation region 4 (due to collisions between the debris and the fuel droplet). A change in the trajectory of a subsequent droplet of fuel may affect the position and/or the orientation of the subsequent droplet of fuel when a pulse of the pre-pulse laser beam 109 is incident on the droplet of fuel. This may in turn affect the fraction of a pre-pulse laser beam 109 which is reflected from the droplet of fuel and thus may affect the power of a reflection of the pre-pulse laser beam 109 which propagates through the pre-amplifier 119. The power of the reflected pre-pulse laser beam 109 which propagates through the pre-amplifier 119 affects the amount by which the available gain in the pre-amplifier is reduced due to gain stripping, which in turn affects the amount by which a subsequent pulse of the main-pulse laser beam 111 is amplified in the pre-amplifier 119.

Gain stripping which may occur in the pre-amplifier 119 due to the propagation of a reflection of the pre-pulse laser beam 109 through the pre-amplifier 119 may therefore affect a number of properties of the laser radiation source 101 which may lead to unstable operation of the laser radiation source 101. That, is the power of pulses of the main-pulse laser beam 111 which is incident on the fuel target 129 may be different for different pulses. Unstable operation of the laser radiation source 101 may disadvantageously lead to unstable operation of an EUV radiation source SO which is driven by the laser radiation source 101. It is therefore desirable to substantially prevent a reflection of the pre-pulse laser beam 109 from propagating through the pre-amplifier 119 so as to prevent unstable operation of the laser radiation source 101.

In order to substantially prevent a reflection of the pre-pulse laser beam 109 and/or a reflection of the main-pulse laser beam 111 from propagating through the pre-amplifier 119, an optical isolator 121 is positioned in the common optical path 117 of the pre-pulse and main-pulse laser beams. The optical isolator 121 is configured to substantially block a reflection of the pre-pulse laser beam 109 and/or the main-pulse laser beam 111 from propagating towards the pre-amplifier 119 and the laser module 103, whilst allowing the pre-pulse and main-pulse laser beams to propagate towards the fuel target 129.

In the embodiment which is shown in FIG. 3, the optical isolator 121 comprises a polarizer 131 and a phase retarder 133. The polarizer 131 is configured to only transmit radiation having a given linear polarization state. The pre-pulse and main-pulse laser beams which are received from the laser module 103 may be linearly polarized and may have the given polarization state which is transmitted by the polarizer 131. The polarizer 131 may therefore substantially transmit the pre-pulse and main-pulse laser beams as they propagate from the laser module 103 and towards the fuel target 129.

The phase retarder 133 is configured to cause a phase retardance between perpendicularly polarized components of both the pre-pulse and main-pulse laser beams. For example, in an embodiment the phase retarder 133 may be configured to cause a phase retardance between perpendicularly polarized components of the pre-pulse and main-pulse laser beams such that the phase retarder converts linearly polarized radiation into circularly polarized radiation and vice-versa.

In an embodiment the phase retarder 131 may include a reflective phase retarder which may, for example, comprise a multilayer mirror. The reflective phase retarder may be orientated relative to the common optical path 117 of the pre-pulse and main-pulse laser beams such that the plane of incidence at the reflective phase retarder forms an angle of approximately 45° with the plane of polarization of the pre-pulse and main-pulse laser beams. The pre-pulse and main-pulse laser beams which are incident on the reflective phase retarder therefore comprise an s-polarized component and a p-polarized component of approximately equal magnitude. The reflective phase retarder may be configured to cause a phase retardance of approximately 90° between the s and p-polarized components which are incident on the reflective phase retarder. In such an embodiment the linear polarization states of the pre-pulse and main-pulse laser beams are converted to a substantially circularly polarized state by the phase retarder 133.

In embodiments in which the phase retarder 133 includes a reflective phase retarder the direction of propagation of the pre-pulse and main-pulse laser beams is changed by reflection from the reflective phase retarder. In such embodiments, the phase retarder 133 may include one or more further reflective elements which are arranged so as to redirect the pre-pulse and main-pulse laser beams such that they propagate along a desired optical path (e.g. towards the amplification stage 123).

In other embodiments the phase retarder 133 may include a transmissive wave plate. For example, the phase retarder 133 may include a quarter-wave plate. In an embodiment, the quarter-wave plate may be arranged such that an optic axis of the quarter-wave plate forms an angle of approximately 45° with a polarization plane of the pre-pulse and main-pulse laser beams such that the quarter-wave plate converts the linear polarization state of the pre-pulse and main-pulse laser beams to a substantially circularly polarized state.

Some embodiments of a phase retarder 133 may include a plurality of optical elements which are configured to adjust the polarization state of the pre-pulse and main-pulse laser beams by introducing a phase retardance between perpendicularly polarized components of the pre-pulse and main-pulse laser beams. In general the phase retarder may comprise any optical element or combination of optical elements which are configured to introduce a phase retardance between perpendicularly polarized components of the pre-pulse and main-pulse laser beams.

In some embodiments the phase retarder 133 is configured to convert the linear polarization states of the pre-pulse and main-pulse laser beams to approximately circular polarization states such that the pre-pulse and main-pulse laser beams which propagate from the phase retarder 133 and towards the fuel target 129 are each approximately circularly polarized. A circular polarization state has a handedness which represents the direction in which the electric field vector rotates with time. For example, a circularly polarized laser beam may have a right-handed circular polarization state (corresponding to clockwise rotation of the electric field vector as viewed along the direction of propagation of the laser beam) or a left-handed circular polarization state (corresponding to anti-clockwise rotation of the electric field vector as viewed along the direction of propagation of the laser beam).

The handedness of a circular polarization state of a laser beam may be reversed by reflection of the laser beam from a surface on which the laser beam is incident at approximately normal incidence. That is, a laser beam having a right-handed circular polarization state which is reflected at approximately normal incidence results in a reflected laser-beam having a left-handed circular polarization state and vice-versa.

As was described above, both the pre-pulse and main-pulse laser beams undergo a reflection from the fuel target 129 at close to normal incidence. The handedness of the polarization states of the pre-pulse and main-pulse laser beams are therefore reversed during reflection from the fuel target. Reflections of the pre-pulse and main-pulse laser beams from the fuel target therefore have approximately circular polarization states of opposite handedness to the circular polarization states of the pre-pulse and main-pulse laser beams which are incident on the fuel target.

Reflections of the pre-pulse and main-pulse laser beams propagate back along the reverse of the common optical path 117 such that they are incident on the optical isolator 121. The phase retarder 133 of the optical isolator 121 introduces a phase retardance between perpendicularly polarized components of the reflections of the pre-pulse and main-pulse laser beams. The phase retardance which is introduced to the reflections of the pre-pulse and main-pulse laser beams by the phase retarder 133 is the same as the phase retardance which was introduced to the pre-pulse and main-pulse laser beams as they propagated towards the fuel target.

As was described above, the reflections of the pre-pulse and main-pulse laser beams which are incident on the phase retarder are approximately circularly polarized with an opposite handedness to the pre-pulse and main-pulse laser beams which propagate towards the fuel target 129. The approximately circular polarization states of the reflected pre-pulse and main-pulse laser beams are converted to approximately linear polarization states by the phase retarder 133. However, since the reflected pre-pulse and main-pulse laser beams have approximately circular polarization states of opposite handedness to the circular polarization states of the pre-pulse and main-pulse laser beams which propagate towards the fuel target 129, then the linear polarization states of the reflected pre-pulse and main-pulse laser beams which are output from the phase retarder 133 are approximately orthogonal to the linear polarization states of the pre-pulse and main-pulse laser beams which propagate towards the fuel target 129.

As was described above the polarizer 131 is arranged so as to transmit radiation having the linear polarization state of the pre-pulse and main-pulse laser beams which are output from the laser module 103. If the reflected pre-pulse and main-pulse laser beams which are incident on the polarizer 131 have linear polarization states which are approximately orthogonal to the linear polarization states of the pre-pulse and main-pulse laser beams which are transmitted by the polarizer 131 towards the fuel target 129, then the reflected pre-pulse and main-pulse laser beams are blocked by the polarizer 131, thereby preventing reflections of the pre-pulse and main-pulse laser beams from propagating towards the pre-amplifier 119 and the laser module 103.

It will be appreciated from the above description that if the reflected pre-pulse laser beam and the reflected main-pulse laser beam which are incident on the polarizer 131 both have the same linear polarization state which is orthogonal to the polarization state which is transmitted by the polarizer 131 then both the reflected pre-pulse laser beam and the main-pulse laser beam will be blocked by the polarizer 131.

However, as was mentioned above, the pre-pulse and main-pulse laser beams have different wavelengths. The different wavelengths of the pre-pulse and main-pulse laser beams may cause the two beams to undergo different polarization changes during their passage from the laser module 103 to the fuel target 129 and back again. For example, the phase retardance which is introduced to the pre-pulse laser beam 109 by the phase retarder 133 may be slightly different to the phase retardance which is introduced to the main-pulse laser beam 111. If the pre-pulse laser beam 109 and the main-pulse laser beam 111 were to follow the same optical path throughout the laser radiation system 101 then this difference in the polarization changes which the pre-pulse and main-pulse laser beams experience would cause reflections of the pre-pulse and main-pulse laser beams to be incident on the polarizer 131 with different polarization states. In the event that the reflections of the pre-pulse and main-pulse laser beams which are incident on the polarizer 131 have different polarization states then at least a portion of one or both of the reflections will be undesirably transmitted by the polarizer 131.

In order to reduce any transmission of reflections of the pre-pulse or main-pulse laser beams through the polarizer 131, the laser radiation source 101 is provided with a beam-separation apparatus 125. The beam separation apparatus 125 is configured to separate the optical paths of the pre-pulse and main-pulse laser beams and recombine the optical paths of the pre-pulse and main-pulse laser beams. The beam separation apparatus 125 therefore provides a separated portion of the optical paths of the pre-pulse and main-pulse laser beams which may allow for independent adjustment of the pre-pulse and main-pulse laser beams.

In the embodiment which is depicted in FIG. 3, the beam separation apparatus 125 comprises a first dichroic mirror 135a and a second dichroic mirror 135b. The dichroic mirrors 135a, 135b are each configured to substantially reflect radiation having the wavelength of the pre-pulse laser beam 109 and to substantially transmit radiation having the wavelength of the main-pulse laser beam 111. The first dichroic mirror 135a is arranged to reflect the pre-pulse laser beam 109 away from the optical path of the main-pulse laser beam 111 so as to separate the optical paths of the pre-pulse and main-pulse laser beams. The second dichroic mirror 135b is arranged to re-combine the optical paths of the pre-pulse and main-pulse laser beams. The beam separation apparatus further comprises two mirrors 137a and 137b which are arranged to direct the pre-pulse laser beam 109 between the first dichroic mirror 135a and the second dichroic mirror 135b.

In other embodiments, the beam separation apparatus may take other forms. For example, in an alternative embodiment the dichroic mirrors 135a, 135b may be configured to substantially transmit radiation having the wavelength of the pre-pulse laser beam 109 and to substantially reflect radiation having the wavelength of the main-pulse laser beam 111. In general the beam separation apparatus may comprise any apparatus which is configured to separate the optical paths of the pre-pulse and main-pulse laser beams and recombine the optical paths of the pre-pulse and the main-pulse laser beams.

The beam separation apparatus 125 provides separated portions of the optical paths of the pre-pulse and main-pulse laser beams. In the embodiment of FIG. 3, a first polarization adjuster 139 is provided in the separated optical path of the pre-pulse laser beam 109 and a second polarization adjuster 141 is provided in the separated optical path of the main-pulse laser beam 111. The first and second polarization adjusters 139, 141 are configured to adjust the polarization states of the pre-pulse and the main-pulse laser beams independently of one another. For example, the first and second polarization adjusters 139, 141 may be configured to introduce different phase retardances to the pre-pulse and main-pulse laser beams.

In the embodiment which is shown in FIG. 3, the first and second polarization adjusters 139, 141 may be configured to independently adjust the polarization states of the pre-pulse and main-pulse laser beams such that reflections of the pre-pulse and main-pulse laser beams which are incident on the polarizer 131 have substantially the same linear polarization state. In particular the first and second polarization adjusters may be configured to independently adjust the polarization states of the pre-pulse and main-pulse laser beams such that reflections of the pre-pulse and main-pulse laser beams which are incident on the polarizer 131 have a linear polarization state which is orthogonal to the polarization state which is transmitted by the polarizer 131. In such an embodiment the polarizer 131 substantially blocks reflections of both the pre-pulse and the main-pulse laser beams from propagating towards the pre-amplifier 119 and the laser module 103.

One or both of the first and second polarization adjusters 139, 141 may comprise a transmissive wave plate. For example, the first and/or the second polarization adjuster 139, 141 may comprise a half-wave plate which is configured to introduce a phase retardance to the pre-pulse or the main-pulse laser beam. The phase retardance which is caused by a half-wave plate may adjusted by rotation of the half-wave plate. A half-wave plate may be orientated so as to cause a desired phase retardance in the pre-pulse or main-pulse laser beam.

In the embodiment which is shown in FIG. 3 the polarization state of both the pre-pulse and the main-pulse laser beams are adjusted independently with the first and second polarization adjusters 139, 141. However, in some embodiments the polarization state of only one of the pre-pulse or the main-pulse laser beam may be independently adjusted with a polarization adjuster.

For example, in an embodiment the phase retarder 133 may be configured to introduce a phase retardance of 90° to the main-pulse laser beam 111 so as to convert the linear polarization state of the main-pulse laser beam to a substantially circular polarization state. As was explained above the handedness of the circular polarization state of the main-pulse laser beam 111 is reversed by reflection from the fuel target such that a reflection of the main-pulse laser beam 111 has a substantially circular polarization state of opposite handedness to the polarization state of the main-pulse laser beam 111 which propagates towards the fuel target 129. The reflection of the main-pulse laser beam 111 undergoes a phase retardance at the phase retarder 133 which converts the circular polarization state of the reflection to a linear polarization state which is perpendicular to the linear polarization state of the main-pulse laser beam 111 which is transmitted by the polarizer 131. The reflection of the main-pulse laser beam 111 is therefore substantially blocked by the polarizer 131 from propagating towards the pre-amplifier 119. In such an embodiment the second polarization adjuster 141 may therefore be discarded since no further adjustment to the polarization state of the main-pulse laser beam 111 may be needed in order to block a reflection of the main-pulse laser beam 111 at the polarizer 131.

However, since the pre-pulse laser beam 109 has a different wavelength to the main-pulse laser beam 111 the phase retardance which is introduced to the pre-pulse laser beam 109 by the phase retarder 133 may be different to 90°. For example, the phase retardance which is introduced to the pre-pulse laser beam 109 by the phase retarder 133 may be such that the linear polarization state of the pre-pulse laser beam 109 is converted to an elliptical polarization state. If the pre-pulse laser beam 109 were to be subjected to no further phase retardances on its optical path to the fuel target 129 then a reflection of the pre-pulse laser beam 109 would have an elliptical polarization state of opposite handedness to the elliptical polarization state of the pre-pulse laser beam 109 which propagates towards the fuel target 129. The elliptical polarization state of the reflection of the pre-pulse laser beam 109 would be converted to a linear polarization state at the phase retarder 133. However the linear polarization state of the reflection of the pre-pulse laser beam 109 which is incident on the polarizer 131 would not be perpendicular to the linear polarization state which is transmitted by the polarizer 131. The reflection of the pre-pulse laser beam 109 which is incident on the polarizer 131 would therefore include a component which is transmitted by the polarizer 131 and which may therefore enter the pre-amplifier 119 and propagate towards the laser module 103.

In order to reduce the transmission of a reflection of the pre-pulse laser beam 109 at the polarizer 131, a further phase retardance may be introduced to the pre-pulse laser beam 109 by the first polarization adjuster 139 (independently of the main-pulse laser beam 111). The phase retardance which is introduced by the first polarization adjuster 139 may compensate for the difference in phase retardance which is introduced to the main-pulse and pre-pulse laser beams at the phase retarder 133. For example, the phase retardance which is introduced to the pre-pulse laser beam 109 by the first polarization adjuster 139 may be sufficient to convert the polarization state of the pre-pulse laser beam 109 from an elliptical polarization state to a circular polarization state. Converting the polarization state of the pre-pulse laser beam 109 to a circular polarization state may result in a reflection of the pre-pulse laser beam 109 which is incident on the polarizer 131 having a linear polarization state which is orthogonal to the linear polarization state which is transmitted by the polarizer 131. The polarizer 131 may therefore substantially block a reflection of the pre-pulse laser beam from propagating towards the pre-amplifier 119 and the laser module 103.

In an alternative embodiment the phase retarder 133 may be configured to convert the polarization state of the pre-pulse laser beam 109 to a substantially circular polarization state. In such an embodiment the first polarization adjuster 139 may therefore be discarded since no further adjustment to the polarization state of the pre-pulse laser beam 109 may be needed in order to block a reflection of the pre-pulse laser beam 109 at the polarizer 131. In such an embodiment the phase retarder 133 may convert the polarization state of the main-pulse laser beam 111 to an elliptical polarization state. In order to reduce any transmission of a reflection of the main-pulse laser beam 111 at the polarizer 131, the second polarization adjuster 141 may be configured to introduce an additional phase retardance to the main-pulse laser beam 111 so as to cause a reflection of the main-pulse laser beam 111 which is incident on the polarizer 131 to have a polarization state which is substantially perpendicular to the polarization state which is transmitted by the polarizer 131.

Whilst embodiments have been described above in which only the polarization state of one of the pre-pulse laser beam 109 and the main-pulse laser beam 111 is adjusted independently of the other laser beam, in other embodiments the polarization state of both the pre-pulse and the main-pulse laser beams may be adjusted independently using the first and second polarization adjusters 139, 141 shown in FIG. 3. It may, for example, be advantageous to be able to adjust the polarization states of both the pre-pulse and main-pulse laser beams in order to compensate for any alterations of the polarization state of the pre-pulse and main-pulse laser beams which occur along the optical path of the laser beams. For example, during propagation of the pre-pulse and the main-pulse laser beams through the beam delivery system 127, the pre-pulse and main-pulse laser beams may undergo one or more reflections which alter the polarization states (e.g. by causing a phase retardance) of the pre-pulse and main-pulse laser beams. Any such alterations of the polarization states of the pre-pulse and main-pulse laser beams may be compensated for by independently adjusting the polarization states of the pre-pulse and the main-pulse laser beams with the first and second polarization adjusters.

In an alternative embodiment, a laser radiation source 101 may include a polarization adjuster which is positioned in the common optical path 117 of the pre-pulse and main-pulse laser beams and which is configured to adjust the polarization state of both the pre-pulse and the main-pulse laser beams. A polarization adjuster which is positioned in the common optical path 117 of the pre-pulse and the main-pulse laser beams may, for example, cause different polarization adjustments in the pre-pulse and main-pulse laser beams due to the different wavelengths of the pre-pulse and main-pulse laser beams. In order to compensate for the difference in polarization adjustment to the pre-pulse and the main-pulse laser beam, one or more further polarization adjusters may be positioned in the separated optical path of the pre-pulse or the main-pulse laser beam in the beam separation apparatus so as to allow the polarization state of the pre-pulse laser beam and/or the main-pulse laser beam to be adjusted independently of the other laser beam.

Whilst the beam separation device 125 has been described above in the context of allowing independent adjustment to the polarization state of the pre-pulse and/or the main-pulse laser beams the beam separation device 125 may serve other functions. For example, the beam separation device 125 may allow the position, direction of propagation and/or divergence of the pre-pulse and/or the main-pulse laser beams to be independently adjusted. As was mentioned above pulses of the pre-pulse and main-pulse laser beams serve different functions and are incident on the fuel target 129 at different times. As such it may be desirable to independently adjust one or more properties of the pre-pulse and/or the main-pulse laser beams so as to condition the laser beams to perform their desired functions.

In embodiments in which one or more properties of the pre-pulse and/or the main-pulse laser beams are independently adjusted, the optical paths of the pre-pulse and main-pulse laser beams may not be precisely recombined by the beam separation device 125. That is, the optical paths of the pre-pulse and main-pulse laser beams through the beam delivery apparatus 127 and to the fuel target 129 may not be precisely the same and the position at which the pre-pulse and main-pulse laser beams are incident on the fuel target 129 may not be precisely the same. However, the beam separation device 125 may be considered to substantially recombine the optical paths of the pre-pulse and main-pulse laser beams such that common optical components may be used to direct or adjust both the pre-pulse and the main-pulse laser beams. Embodiments of a laser radiation source have been described above which include at least one polarization adjuster configured to adjust the polarization state of the pre-pulse laser beam 109 and/or the main-pulse laser beam 111. As was described above a polarization adjuster may, for example, comprise a wave plate (e.g. a half-wave plate). However, in some embodiments a polarization adjuster may take other forms and may comprise any optical element or combination of optical elements which are configured to adjust the polarization state of the pre-pulse laser beam 109 and/or the main pulse laser beam 111.

Figure 4:
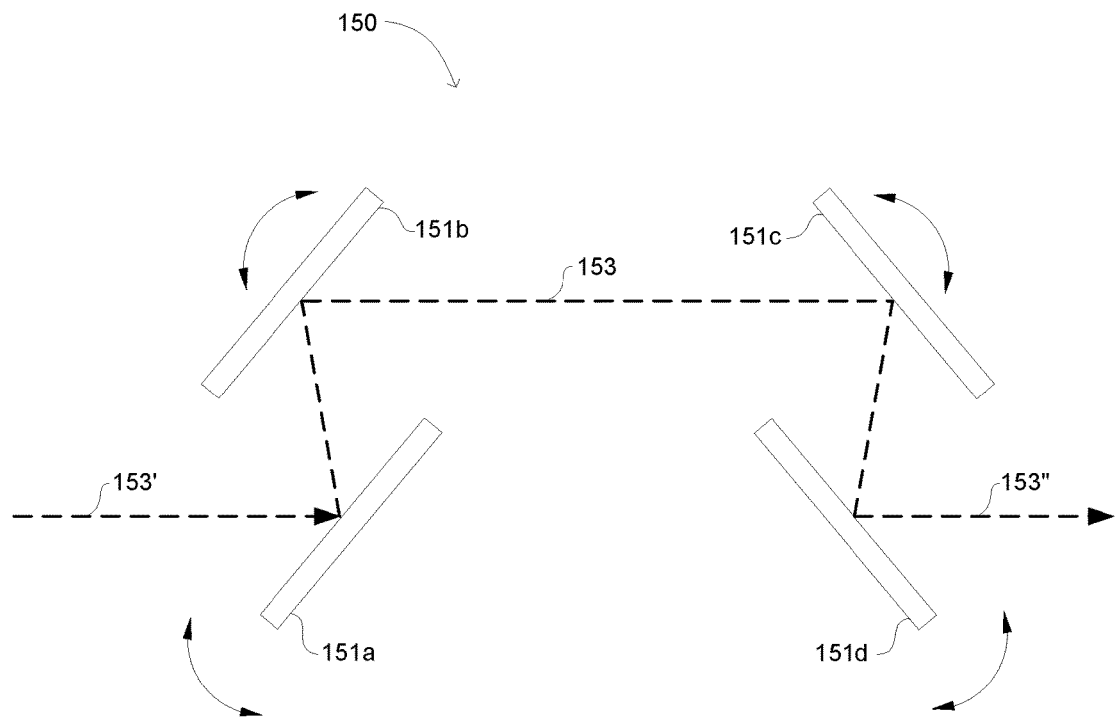
FIG. 4 is a schematic illustration of a polarization adjuster which may form part of a laser radiation source according to an embodiment of the invention.

FIG. 4, is a schematic illustration of an embodiment of a polarization adjuster 150. The polarization adjuster 150 comprises four mirrors 151a-151d arranged to reflect a laser beam 153. A first mirror 151a receives an input laser beam 153' and reflects the laser beam to be incident on a second mirror 151b. The second mirror 151b reflects the laser beam to be incident on a third mirror 151c. The third mirror 151c reflects the laser beam to be incident on a fourth mirror 151d. The fourth mirror 151d reflects the laser beam so as to provide an output laser beam 153". In the embodiment which is shown in FIG. 4 the mirrors 151a-151d are arranged such that the output laser beam 153" is approximately collinear with the input laser beam 153'. The polarization adjuster 150 does not therefore substantially alter the direction of propagation of the laser beam 153.

At least one of the mirrors 151a-151d is a reflective phase retarder. A reflective phase retarder may, for example, comprise a multi-layer mirror which is configured to introduce a phase retardance to the laser beam 153. In an embodiment a single one of the mirrors 151a-151d is a reflective phase retarder and the remaining mirrors are non-phase retarding mirrors. In other embodiments a plurality of the mirrors 151a-151d may be reflective phase retarders and any remaining mirrors may be non-phase retarding mirrors.

The phase retardance which is introduced to the laser beam 153 by a reflective phase retarder may be a function of the angle of incidence at which the laser beam is incident on the reflective phase retarder. The phase retardance which is introduced to the laser beam by the polarization adjuster 150 may therefore be controlled by controlling the angle of incidence at which the laser beam 153 is incident on the one or more reflective phase retarders of the polarization adjuster 150. For example, the mirrors 151a-151d may be rotatable, as indicated by the double-headed arrows in FIG. 4, so as to change the angle of incidence with which the laser beam 153 is incident on the mirrors 151a-151d and thereby change the phase retardance which is introduced to the laser beam 153 by the polarization adjuster 150.

The mirrors 151a-151d may, for example, be rotated by one or more actuators (not shown) which are operable to rotate the mirrors so as to change the angle of incidence with which the laser beam 153 is incident on the mirrors. The mirrors 151a-151d may be rotated together such that the position and direction of propagation of the laser beam 153 is not changed by rotation of the mirrors 151a-151d. For example, the mirrors 151a-151d may be rotated together such that the angle of incidence at each mirror is the same for all four mirrors 151a-151d.

A polarization adjuster 150 of the form which is shown in FIG. 4 may, for example, be used as the first polarization adjuster 139 and/or the second polarization adjuster 141 which are positioned in the separated optical paths of the pre-pulse and main-pulse laser beams. Additionally or alternatively a polarization adjuster 150 of the form which is shown in FIG. 4 may be positioned in the common optical path 117 of the pre-pulse and main-pulse laser beams such that the polarization adjuster 150 adjusts the polarization state of both the pre-pulse and the main-pulse laser beams.

The embodiment of a polarization adjuster 150 includes four mirrors 151a-151d of which at least one is a reflective phase retarder. This allows a laser beam 153' which is input to the polarization adjuster to remain collinear with a laser beam 153" which is output from the polarization adjuster. However in other embodiments a polarization adjuster may include a different number of mirrors than four. For example, a polarization adjuster may comprise a single reflective phase retardance whose orientation may be controlled so as to control the phase retardance which is introduced to a laser beam by the phase retarder. However, a polarization adjuster which comprises a single mirror will alter the direction of propagation and the position of a laser beam. An embodiment of a polarization adjuster which comprises two mirrors may be arranged such that the direction of propagation of a laser beam is not altered by the polarization adjuster. However such an embodiment may cause a change in the position of the laser beam.

In the embodiment of a laser radiation source 101 which is shown in FIG. 3, reflections of both the pre-pulse and the main-pulse laser beams are blocked by the same polarizer 131 which forms part of the optical isolator 121. However in some embodiments a polarizer which is used to block a reflection of the pre-pulse laser beam 109 may be separate to a polarizer which is used to block a reflection of the main-pulse laser beam 111.

Figure 5:
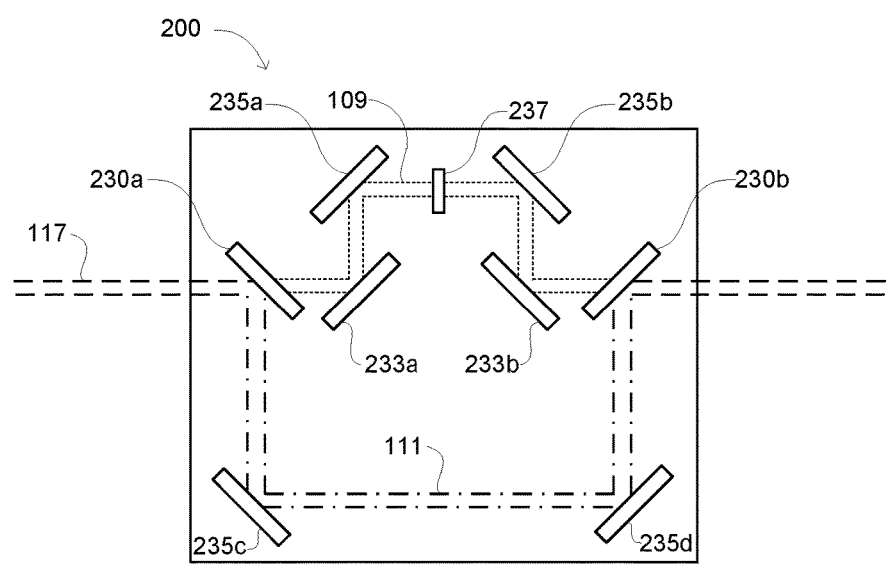
FIG. 5 is a schematic illustration of a pre-pulse isolator which may form part of a laser radiation source according to an embodiment of the invention.

FIG. 5 is a schematic illustration of an embodiment of a pre-pulse isolator 200 which may be used to block a reflection of the pre-pulse laser beam 109 separately from the main-pulse laser beam 111. The pre-pulse isolator 200 may, for example, be included in a laser radiation source in addition to the optical isolator 121. The pre-pulse isolator 200 may be positioned in the common optical path 117 of the pre-pulse and main-pulse laser beams and between the optical isolator 121 and the fuel target 129. In an embodiment of a laser radiation source the pre-pulse isolator 200 may be positioned in the common optical path 117 of the pre-pulse and main-pulse laser beams and between the amplification stage 123 and the fuel target 129.

The pre-pulse isolator 200 comprises a first dichroic mirror 230a which is arranged to separate the optical paths of the pre-pulse and main-pulse laser beams and a second dichroic mirror 230b which is arranged to recombine the optical paths of the pre-pulse and main-pulse laser beams. In the embodiment which is shown in FIG. 5 the dichroic mirrors 230a, 230b are configured to substantially transmit radiation having the wavelength of the pre-pulse laser beam 109 and substantially reflect radiation having the wavelength of the main-pulse laser beam 111. However, in alternative embodiments the dichroic mirrors 230a, 230b may be configured to substantially reflect radiation having the wavelength of the pre-pulse laser beam 109 and substantially transmit radiation having the wavelength of the main-pulse laser beam 111.

The dichroic mirrors 230a, 230b of the pre-pulse isolator 200 provides separated optical paths of the pre-pulse and main-pulse laser beams, which allows the pre-pulse and main-pulse laser beams to be treated separately. A first reflective phase retarder 233a is arranged in the separated optical path of the pre-pulse laser beam 109. The pre-pulse laser beam 109 which is incident on the first reflective phase retarder 233a has a polarization state which has been adjusted by the phase retarder 133 of the optical isolator 121. For example, the phase retarder 133 of the optical isolator 121 may introduce a phase retardance to the pre-pulse laser beam 109 which causes the pre-pulse laser beam 109 which is incident on the first reflective phase retarder 233a to have a circular polarization state. The first reflective phase retarder 233a may be configured to introduce a phase retardance in the pre-pulse laser beam which converts the circular polarization state of the pre-pulse laser beam 109 to a substantially linear polarization state.

The pre-pulse laser beam 109 which is reflected from the reflective phase retarder 233a (having a substantially linear polarization state) is incident on a first mirror 235a which is configured to direct the pre-pulse laser beam 109 to pass through a polarizer 237. The polarizer 237 may be configured to transmit the linear polarization state of the pre-pulse laser beam 109 as it propagates towards the fuel target 129. The pre-pulse laser beam 109 is further incident on a second mirror 235b which directs the pre-pulse laser beam 109 to be incident on a second reflective phase retarder 233b.

The second reflective phase retarder 233b may be configured to reverse the change in polarization state of the pre-pulse laser beam 109 which is caused at the first reflective phase retarder 233a such that the pre-pulse laser beam 109 which is reflected from the second reflective phase retarder 233b has substantially the same polarization state as the pre-pulse laser beam 109 which is incident on the first reflective phase retarder. For example, the pre-pulse laser beam 109 which is reflected from the second reflective phase retarder 233b may have a circular polarization state.

The pre-pulse laser beam 109 which is reflected from the second reflective phase retarder 233b is recombined with the optical path of the main-pulse laser beam 111 at the second dichroic mirror 230b. The main pulse laser beam 111 is directed from the first dichroic mirror 230a to the second dichroic mirror 230b by a third mirror 235a and a fourth mirror 235d.

As was described above the pre-pulse laser beam 109 which is output from the pre-pulse isolator 200 and which propagates towards the fuel target 129 may have substantially the same polarization state as the pre-pulse laser beam 109 which arrives at the pre-pulse isolator 200. The pre-pulse isolator 200 may therefore make substantially no net change to the polarization state of the pre-pulse laser beam 109 as it propagates towards the fuel target 129. Similarly the pre-pulse isolator 200 may make substantially no net change to the polarization state of the main-pulse laser beam 111.

A reflection of the pre-pulse laser beam 109 from the fuel target 129 which returns to the pre-pulse isolator 200 will be incident on the second reflective phase retarder 233b. The second reflective phase retarder 233b introduces a phase retardance to a reflection of the pre-pulse laser beam 109 which converts the circular polarization state of the reflection of the pre-pulse laser beam 109 to a linear polarization state. A reflection of the pre-pulse laser beam 109 which is incident on the polarizer 237 is therefore substantially linearly polarized. Since the handedness of the circular polarization state of the pre-pulse laser beam is reversed during reflection of the pre-pulse laser beam 109 from the fuel target 129, the linear polarization state of a reflection of the pre-pulse laser beam which is incident on the polarizer 237 may be substantially perpendicular to the linear polarization state which is transmitted by the polarizer 237. The polarizer 237 therefore serves to substantially block a reflection of the pre-pulse laser beam 109 from propagating towards the laser module 101.

In an alternative embodiment of the pre-pulse isolator 200, the polarizer 237 may be formed on the first mirror 235a or the second mirror 235b. For example, the first mirror 235a or the second mirror 235b may be coated with an absorbing thin file polarizer.

In an embodiment of a laser radiation source in which the pre-pulse isolator 200 is positioned between an amplification stage 123 and the fuel target 129, the pre-pulse isolator 200 advantageously blocks a reflection of the pre-pulse laser beam 109 from propagating through the amplification stage 123. Blocking a reflection of the pre-pulse laser beam 109 from propagating through the amplification stage 123 prevents the reflection of the pre-pulse laser beam 109 being amplified in the amplification stage 123. The power of a reflection of the pre-pulse laser beam 109 may therefore remain relatively low which may reduce the chances of the reflection of the pre-pulse laser beam 109 from causing damage to components of the laser radiation source. Blocking a reflection of the pre-pulse laser beam 109 from propagating through the amplification stage 123 additionally prevents the reflection of the pre-pulse laser beam 109 from causing gain stripping in the amplification stage.

Some embodiments, of a laser radiation source may include a separate pre-pulse isolator 200 and a separate beam separation device 125. However, in some embodiments a pre-pulse isolator may be arranged in the separated optical path of the pre-pulse laser beam 109 in the beam separation device 125. For example, one or more phase retarders and a polarizer may be arranged in the separated optical path of the pre-pulse laser beam 109 in the beam separation device 125 and may be configured to block a reflection of the pre-pulse laser beam 109 from propagating towards the laser module 103.

A reflection of the main-pulse laser beam 111 from the fuel target 129 which returns to the pre-pulse isolator 200 is not incident on the polarizer 237. The pre-pulse isolator 200 which is depicted in FIG. 5 does not therefore serve to block a reflection of the main-pulse laser beam 111 from propagating towards the laser module 103. A reflection of the main-pulse laser beam propagates through the pre-pulse isolator 200 and returns to the optical isolator 121. In an embodiment of a laser radiation source which includes a pre-pulse isolator which is configured to block a reflection of the pre-pulse laser beam 109, the optical isolator 121 may be configured to block a reflection of the main-pulse laser beam 111.

In an alternative embodiment, an additional polarizer may be positioned in a separated optical path of the main-pulse laser beam 111. Additionally one or more phase retarders may be positioned in the separated optical path of the main-pulse laser beam 111 such that a reflection of the main-pulse laser beam 111 is incident on the additional polarizer with a polarization state which causes the reflection of the main-pulse laser beam 111 to be blocked by the additional polarizer. In an embodiment an additional polarizer and one or more phase retarders may be positioned in the separated optical path of the main-pulse laser beam 111 in the beam separation device 125 and/or in a pre-pulse isolator 200.

In embodiments in which an additional polarizer and one or more phase retarders is positioned in a separated optical path of the main-pulse laser beam 111 between an amplification stage 123 and the fuel target, a reflection of the main-pulse laser beam may be blocked from propagating through the amplification stage 123. Blocking a reflection of the main-pulse laser beam 111 from propagating through the amplification stage 123 advantageously prevents amplification of the reflection of the main-pulse laser beam 111 and prevents a reflection of the main-pulse laser beam 111 from causing gain-stripping in the amplification stage 123. However positioning a polarizer in the path of the main-pulse laser beam 111 between the amplification stage and the fuel target 129 means that the main-pulse laser beam which is incident on the polarizer and which propagates towards the fuel target has been amplified in the amplification stage 123. Amplification of the main-pulse laser beam 111 in the amplification stage 123 may result in a main-pulse laser beam 111 having a relatively high power. The power of the amplified main-pulse laser beam 111 may, for example, be sufficient to cause damage to a polarizer. Positioning a polarizer in the path of the main-pulse laser beam 111 between the amplification stage and the fuel target 129 may therefore result in damage being caused to the polarizer.

In general the pre-pulse laser beam 109 has a lower power than the main-pulse laser beam 111. A polarizer which is positioned in a separated optical path of an amplified pre-pulse laser beam 109 may therefore be less likely to result in damage being caused to the polarizer than to a polarizer which is positioned in a separated optical path of an amplified main-pulse laser beam 111.

As was mentioned above, in some embodiments a first polarizer may be positioned in a separated optical path of the pre-pulse laser beam 109 and a second polarizer may be positioned in a separated optical path of the main-pulse laser beam 111. The first polarizer may be configured to substantially block radiation having the polarization state of a reflection of the pre-pulse laser beam 109 so as to block the reflection of the pre-pulse laser beam 109 from propagating towards the laser module 103. The second polarizer may be configured to substantially block radiation having the polarization state of a reflection of the main-pulse laser beam 111 so as to block the reflection of the main-pulse laser beam 111 from propagating towards the laser module 103.

It will be appreciated that in embodiments in which separate first and second polarizers are positioned in separated optical paths of the pre-pulse and main-pulse laser beams so as to block reflections of the pre-pulse and main-pulse laser beams, there may be no need for a polarizer to be positioned in the common optical path of the pre-pulse and main-pulse laser beams. In such embodiments the polarization states of the pre-pulse and main-pulse laser beams may be treated entirely separately. For example, the pre-pulse and main-pulse laser beams may be emitted from the laser module 103 having different linear polarization states. In such embodiments the first and second polarizers which are positioned in separated optical paths of the pre-pulse and main-pulse laser beams may be configured to transmit different polarization states and may be configured to block different polarization states. The polarization states of reflections of the pre-pulse and main-pulse laser beams therefore need not be the same since the first and second polarizers may be independently configured to separately block the reflections.

Figure 6:
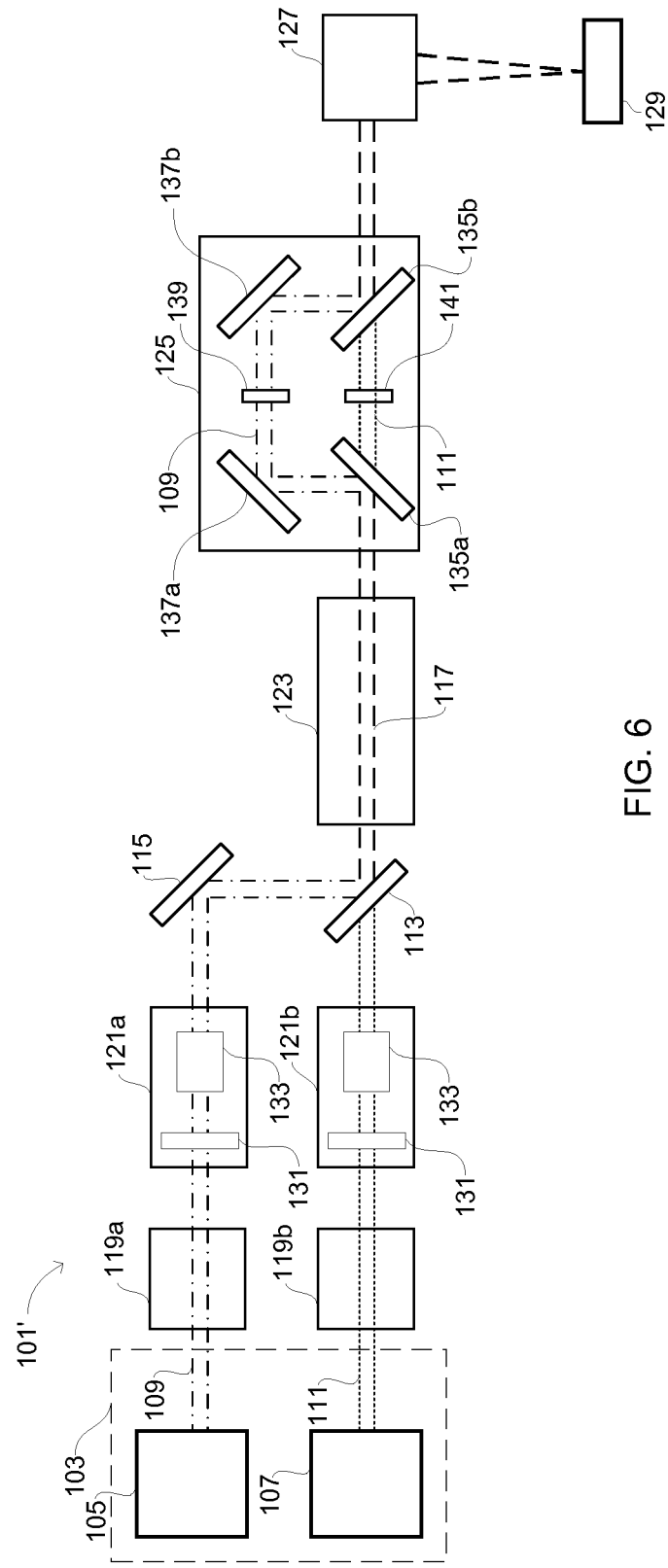
FIG. 6 is a schematic illustration of an alternative embodiment of a laser radiation source according to the invention.

FIG. 6 is a schematic illustration of an alternative embodiment of a laser radiation source 101'. The laser radiation source 101' which is shown in FIG. 6 differs from the laser radiation source 101 which is shown in FIG. 3 in that the pre-pulse laser beam and the main-pulse laser beam propagate through separate pre-amplifiers and separate optical isolators before being combined in a common optical path 117.

The laser radiation source 101' includes a laser module 103 comprising a pre-pulse seed laser 105 configured to emit a pre-pulse laser beam 109 and a main-pulse seed laser 107 configured to emit a main-pulse laser beam 111. The pre-pulse laser beam 109 is amplified in a first pre-amplifier 119a. The main-pulse laser beam 111 is amplified in a second pre-amplifier 119b. A first optical isolator 121a is positioned in the path of the pre-pulse laser beam 109 and a second optical isolator 121b is positioned in the path of the main-pulse laser beam 111. The first and second optical isolators 121a, 121b each include a polarizer 131 and a phase retarder 133.

The pre-pulse and main-pulse laser beams are combined at a beam combiner 113 which may, for example, comprise a dichroic mirror. The beam combiner 113 serves to combine the optical paths of the pre-pulse and main-pulse laser beams as they propagate towards the fuel target and to separate the optical paths of reflections of the pre-pulse and main-pulse laser beams as they propagate towards the laser module 103. The beam combiner 113 therefore ensures that only a reflection of the pre-pulse laser beam 109 reaches the first optical isolator 121a and only a reflection of the main-pulse laser beam 111 reaches the second optical isolator 121b. The first optical isolator 121a may therefore be independently configured to block a reflection of the pre-pulse laser beam 109 from propagating towards the laser module 103 and the second optical isolator 121b may be independently configured to block a reflection of the main-pulse laser beam 111 from propagating towards the laser module 103. Providing separate optical isolators 121a and 121b for the pre-pulse and main-pulse laser beams may therefore allow the polarization states of the pre-pulse and main-pulse laser beams to be treated separately.

The laser radiation source 101' which is shown in FIG. 6 includes separate first and second pre-amplifiers 119a, 119b which are configured to amplify the pre-pulse and main-pulse laser beams respectively. The provision of a separate second pre-amplifier 119b which is configured to amplify the main-pulse laser beam 111 and which is positioned in a separated optical path of the main-pulse laser beam 111 prevents a reflection of the pre-pulse laser beam 109 from passing through the second pre-amplifier 119b which is used to amplify the main-pulse laser beam 111. A reflection of the pre-pulse laser beam 109 does not therefore cause gain-stripping in the second pre-amplifier and therefore the gain which is available in the second pre-amplifier 119b is not decreased by a reflection of the pre-pulse laser beam 109.

In the embodiment of a laser radiation source 101' which is shown in FIG. 6 the beam combiner 113 is configured to substantially transmit radiation having the wavelength of the main-pulse laser beam 111 and to substantially reflect radiation having the wavelength of the pre-pulse laser beam 109. However, in practice the beam combiner 113 may transmit a small portion of a reflection of the pre-pulse laser beam 109 and may reflect a small portion of a reflection of the main-pulse laser beam 111. A small portion of a reflection of the pre-pulse laser beam 109 may therefore be incident on the second optical isolator 121*b* and a small portion of a reflection of the main-pulse laser beam 111 may be incident on the first optical isolator 121*a*. Since the first optical isolator 121*a* is specifically configured to block a reflection of the pre-pulse laser beam 109 and the second optical isolator 121*b* is specifically configured to block a reflection of the main-pulse laser beam 111, the first optical isolator 121*a* may transmit a small portion of the reflection of the main-pulse laser beam 111 and the second optical isolator 121*b* may transmit a small portion of the reflection of the pre-pulse laser beam 109. This may result in a portion of a reflection of the pre-pulse laser beam 109 passing through the second pre-amplifier 119*b* and a portion of a reflection of the main-pulse laser beam 111 passing through the first pre-amplifier 119*a*.

In order to reduce any transmission of a reflection of the pre-pulse laser beam 109 to the second pre-amplifier 119*b* and/or any transmission of a reflection of the main-pulse laser beam 111 to the first pre-amplifier 119*a*, further wavelength dependent components may be positioned in the separate optical paths the pre-pulse and/or the main-pulse laser beams. For example, one or more dichroic mirrors may be positioned in the separate optical path of the pre-pulse laser beam 109 which are configured to substantially transmit radiation having the wavelength of the pre-pulse laser beam 109 and substantially reflect radiation having the wavelength of the main-pulse laser beam 111. Additionally or alternatively one or more dichroic mirrors may be positioned in the separate optical path of the main-pulse laser beam 111 which are configured to substantially transmit radiation having the wavelength of the main-pulse laser beam 111 and substantially reflect radiation having the wavelength of the pre-pulse laser beam 109.

Multiple embodiments of a laser radiation source have been described above which include one or more components configured to block a reflection of a main-pulse laser beam from propagating towards a laser module and one or more components configured to block a reflection of a pre-pulse laser beam from propagating towards the laser module. It will be appreciated from the described embodiments that there are a number of different configurations of components which may be used to block a reflection of a pre-pulse laser beam and to block a reflection of a main-pulse laser beam.

In general a laser radiation source may include an optical isolation apparatus which is configured to adjust the polarization state of the pre-pulse laser beam such that a reflection of the pre-pulse laser beam from a fuel target has a first polarization state and to adjust the polarization state of the main-pulse laser beam such that a reflection of the main-pulse laser beam from the fuel target has a second polarization state. The optical isolation apparatus is further configured to block radiation having the first and second polarization states such that reflections of the pre-pulse and main-pulse laser beams are substantially blocked from propagating towards a laser module of the laser radiation source.

In some embodiments, the optical isolation apparatus may, for example, comprise the optical isolator 121 and the first and second polarization adjusters 139 and 141 which are shown in the laser radiation source 101 of FIG. 3. In some embodiments, the optical isolation apparatus may, for example, include a pre-pulse isolator such as the pre-pulse isolator 200 shown in FIG. 5. In some embodiments the first and second polarization states may be the same and the optical isolation apparatus may include a single polarizer which may be used to block both a reflection of the pre-pulse laser beam and a reflection of a main-pulse laser beam. In other embodiments the first and second polarization states may be different from each other and the optical isolation apparatus may include separate polarizers configured to block the first and second polarization states.

In some embodiments the optical isolation apparatus may include a polarization adjuster which is positioned in a separated optical path of the pre-pulse laser beam or a separated optical path of the main-pulse laser beam. The polarization adjuster may be configured to adjust the polarization state of the pre-pulse or the main-pulse laser beam independently of the other of the pre-pulse and the main-pulse laser beam.

In other embodiments the polarization states of the pre-pulse and the main-pulse laser beams may only be adjuster together by a polarization adjuster which is positioned in a common optical path of the pre-pulse and main-pulse laser beams. However the different wavelengths of the pre-pulse and main-pulse laser beams may cause the polarization adjustments which are applied to the laser beams to be different for the pre-pulse and main-pulse laser beams. This may result in the first and second polarization states of reflections of the pre-pulse and main-pulse laser beam being different from one another. In such embodiments, separate polarizers may be used to block the first and second polarization states. For example, a first polarizer may be positioned in a separate optical path of the pre-pulse laser beam and may be configured to block the first polarization state. A second polarizer which is configured to block the second polarization state may be positioned in a separated optical path of the main-pulse laser beam or may be positioned in a common optical path of both the pre-pulse and the main-pulse laser beams.

In some embodiments the polarization adjustment which is applied to the pre-pulse laser beam and/or the main-pulse laser beam may controllable. For example, a measurement of a reflection of the pre-pulse laser beam and/or a reflection of the main-pulse laser beam which is not blocked by the optical isolation apparatus may be taken. In the event that the optical isolation apparatus does not substantially block a reflection of the pre-pulse laser beam and a reflection of the main-pulse laser beam then the polarization adjustment which is applied to the pre-pulse and/or the main-pulse laser beams may be altered until the reflections are substantially blocked.

In general the optical isolation apparatus may comprise any combination of components which are configured to adjust the polarization states of the pre-pulse and main-pulse laser beams such that a reflection of the pre-pulse laser beam has a first polarization state and a reflection of the main-pulse laser beam has a second polarization state and to block radiation having the first and second polarization states. It will be appreciated by those skilled in the art that arrangements of components other than those described above may be used to form the optical isolation apparatus.

Whilst embodiments of the invention have been described in the context of a laser radiation source which emits a pre-pulse laser beam and a main-pulse laser beam for excitation of a fuel target, the invention may be used in other applications. For example, the laser radiation source may be configured to emit any first and second laser beams which need to be pre-pulse and main-pulse laser beams. Any references made in this description to pre-pulse and main-pulse laser beams may therefore be more generally replaced by reference to first and second laser beams which need not be pre-pulse and main-pulse laser beam.

Embodiments have been described above in which the optical paths of two laser beams are combined to follow a common optical path. In some embodiments the optical paths of the two laser beams are subsequently separated and recombined. It will be appreciated that whilst reference has been made to combining or recombining the optical paths of two laser beams, the optical paths of the laser beams need not be precisely aligned with each other. In general any reference to the combination of two laser beams such that they follow a common optical path should be interpreted to mean that the optical paths are combined to the extent that common optical components may be used to adjust or direct both laser beams. However the combined optical paths need not be exactly the same. As such any reference to the combination of two laser beams such that they follow a common optical path should not be interpreted to be limited to precise co-propagation of the laser beams and should instead include cases in which the optical paths of the laser beams are slightly different from one another.

In an embodiment, the invention may form part of a mask inspection apparatus. The mask inspection apparatus may use EUV radiation to illuminate a mask and use an imaging sensor to monitor radiation reflected from the mask. Images received by the imaging sensor are used to determine whether or not defects are present in the mask. The mask inspection apparatus may include optics (e.g. mirrors) configured to receive EUV radiation from an EUV radiation source and form it into a radiation beam to be directed at a mask. The mask inspection apparatus may further include optics (e.g. mirrors) configured to collect EUV radiation reflected from the mask and form an image of the mask at the imaging sensor. The mask inspection apparatus may include a processor configured to analyse the image of the mask at the imaging sensor, and to determine from that analysis whether any defects are present on the mask. The processor may further be configured to determine whether a detected mask defect will cause an unacceptable defect in images projected onto a substrate when the mask is used by a lithographic apparatus.

In an embodiment, the invention may form part of a metrology apparatus. The metrology apparatus may be used to measure alignment of a projected pattern formed in resist on a substrate relative to a pattern already present on the substrate. This measurement of relative alignment may be referred to as overlay. The metrology apparatus may for example be located immediately adjacent to a lithographic apparatus and may be used to measure the overlay before the substrate (and the resist) has been processed.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

The term "EUV radiation" may be considered to encompass electromagnetic radiation having a wavelength within the range of 4-20 nm, for example within the range of 13-14 nm. EUV radiation may have a wavelength of less than 10 nm, for example within the range of 4-10 nm such as 6.7 nm or 6.8 nm.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A laser radiation source for a lithographic tool, the laser radiation source comprising:
   a laser module configured to emit a first laser beam having a first wavelength and a second laser beam having a second wavelength;
   a beam separation device configured to separate optical paths of the first and second laser beams and substantially recombine the optical paths of the first and second laser beams;
   a beam delivery system configured to direct the first and second laser beams to be incident on a fuel target; and
   an optical isolation apparatus configured to:
      adjust a polarization state of the first laser beam such that a reflection of the first laser beam from the fuel target has a first polarization state;
      adjust a polarization state of the second laser beam such that a reflection of the second laser beam from the fuel target has a second polarization state; and
      block radiation having the first and second polarization states such that the reflection of the first laser beam and the reflection of the second laser beam are substantially blocked from propagating towards the laser module.

2. The laser radiation source of claim 1, wherein the optical isolation apparatus comprises a first polarization adjuster arranged in the optical path of the first laser beam, wherein the first polarization adjuster is configured to adjust the polarization state of the first laser beam independently of the second laser beam.

3. The laser radiation source of claim 2, wherein the optical isolation apparatus further comprises a second polarization adjuster arranged in the optical path of the second laser beam wherein the second polarization adjuster is configured to adjust the polarization state of the second laser beam.

4. The laser radiation source of claim 3, wherein the second polarization adjuster is arranged in the optical path of the second laser beam and is configured to adjust the polarization state of the second laser beam independently of the first laser beam.

5. The laser radiation source of claim 2, wherein:
   the first polarization state is the same as the second polarization state, and
   the optical isolation apparatus comprises a polarizer positioned in the optical path of both the first laser beam and the second laser beam, and
   the polarizer is configured to block radiation having the first and second polarization states.

6. The laser radiation source of claim 1, wherein the optical isolation apparatus comprises:
a first polarizer positioned in the optical path of the first laser beam wherein the first polarizer is configured to block radiation having the first polarization state; and
a second polarizer positioned in the optical path of the second laser beam wherein the second polarizer is configured to block radiation having the second polarization state.

7. The laser radiation source of claim 6, wherein the first polarizer is positioned in the optical path of the first laser beam and is not positioned in the optical path of the second laser beam.

8. The laser radiation source of claim 1, wherein the optical isolation apparatus comprises at least one phase retarder configured to cause a phase retardance in the first and/or second laser beams.

9. The laser radiation source of claim 8, wherein the at least one phase retarder is configured to convert a substantially linear polarization state to a substantially circular polarization state and to convert a substantially circular polarization state to a substantially linear polarization state.

10. The laser radiation source of claim 8, wherein the phase retarder comprises a reflective phase retarder.

11. The laser radiation source of claim 10, wherein:
the phase retardance which is caused by the reflective phase retarder is a function of an angle of incidence of the first and/or second laser beams on the reflective phase retarder, and
the phase retarder further comprises an actuator configured to alter orientation of the reflective phase retarder so as to alter the angle of incidence of the first and/or second laser beams on the reflective phase retarder.

12. A laser radiation source for a lithographic tool, the laser radiation source comprising:
a first seed laser configured to emit a first laser beam having a first wavelength;
a first amplifier configured to amplify the first laser beam;
a second seed laser configured to emit a second laser beam having a second wavelength which is different from the first wavelength;
a second amplifier configured to amplify the second laser beam;
a beam combination apparatus configured to substantially combine the optical paths of the first amplified laser beam and the second amplified laser beam; and
a beam delivery system configured to direct the first and second amplified laser beams to be incident on a fuel target.

13. The laser radiation source of claim 12, further comprising a first optical isolator arranged in the optical path of the first laser beam between the first amplifier and the beam combination apparatus, wherein the first optical isolator is configured to substantially block a reflection of the first laser beam from the fuel target from propagating towards the first amplifier.

14. The laser radiation source of claim 13, further comprising a second optical isolator arranged in the optical path of the second laser beam between the second amplifier and the beam combination apparatus, wherein the second optical isolator is configured to substantially block a reflection of the second laser beam from the fuel target from propagating towards the second amplifier.

15. A method of providing first and second laser beams, the method comprising:
emitting a first laser beam having a first wavelength and a second laser beam having a second wavelength from a laser module;
separating optical paths of the first and second laser beams and substantially recombining the optical paths of the first and second laser beams;
directing the first and second laser beams to be incident on a fuel target;
adjusting a polarization state of the first laser beam such that a reflection of the first laser beam from the fuel target has a first polarization state;
adjusting a polarization state of the second laser beam such that a reflection of the second laser beam from the fuel target has a second polarization state; and
blocking radiation having the first and second polarization states such that the reflection of the first laser beam and the reflection of the second laser beam are substantially blocked from propagating towards the laser module.

* * * * *